United States Patent [19]

Berlin

[11] Patent Number: 5,701,125

[45] Date of Patent: Dec. 23, 1997

[54] METHOD FOR COMPRESSION OF DATA USING SINGLE PASS LZSS AND RUN-LENGTH ENCODING

[75] Inventor: Gary J. Berlin, Beech Island, S.C.

[73] Assignee: The United States of America as represented by the United States Department of Energy, Washington, D.C.

[21] Appl. No.: 261,225

[22] Filed: Jun. 15, 1994

[51] Int. Cl.[6] .................................... H30M 7/46

[52] U.S. Cl. ................................... 341/63; 341/50

[58] Field of Search ........................ 341/50, 51, 63

[56] References Cited

U.S. PATENT DOCUMENTS

| | | | |
|---|---|---|---|
| 4,186,415 | 1/1980 | Takayama | 358/260 |
| 4,494,151 | 1/1985 | Liao | 358/261 |
| 4,586,027 | 4/1986 | Tsukiyama et al. | 341/63 |
| 4,872,009 | 10/1989 | Tsukiyama et al. | 341/95 |
| 4,988,998 | 1/1991 | O'Brien | 341/55 |
| 5,001,477 | 3/1991 | Hicks et al. | 341/50 |
| 5,381,144 | 1/1995 | Wilson et al. | 341/63 |
| 5,493,407 | 2/1996 | Takahara | 358/261.1 |

*Primary Examiner*—Marc S. Hoff
*Attorney, Agent, or Firm*—Harold M. Dixon; William R. Moser; Paul A. Gottlieb

[57] ABSTRACT

A method used preferably with LZSS-based compression methods for compressing a stream of digital data. The method uses a run-length encoding scheme especially suited for data strings of identical data bytes having large run-lengths, such as data representing scanned images. The method reads an input data stream to determine the length of the data strings. Longer data strings are then encoded in one of two ways depending on the length of the string. For data strings having run-lengths less than 18 bytes, a cleared offset and the actual run-length are written to an output buffer and then a run byte is written to the output buffer. For data strings of 18 bytes or longer, a set offset and an encoded run-length are written to the output buffer and then a run byte is written to the output buffer. The encoded run-length is written in two parts obtained by dividing the run length by a factor of 255. The first of two parts of the encoded run-length is the quotient; the second part is the remainder. Data bytes that are not part of data strings of sufficient length are written directly to the output buffer.

18 Claims, 1 Drawing Sheet

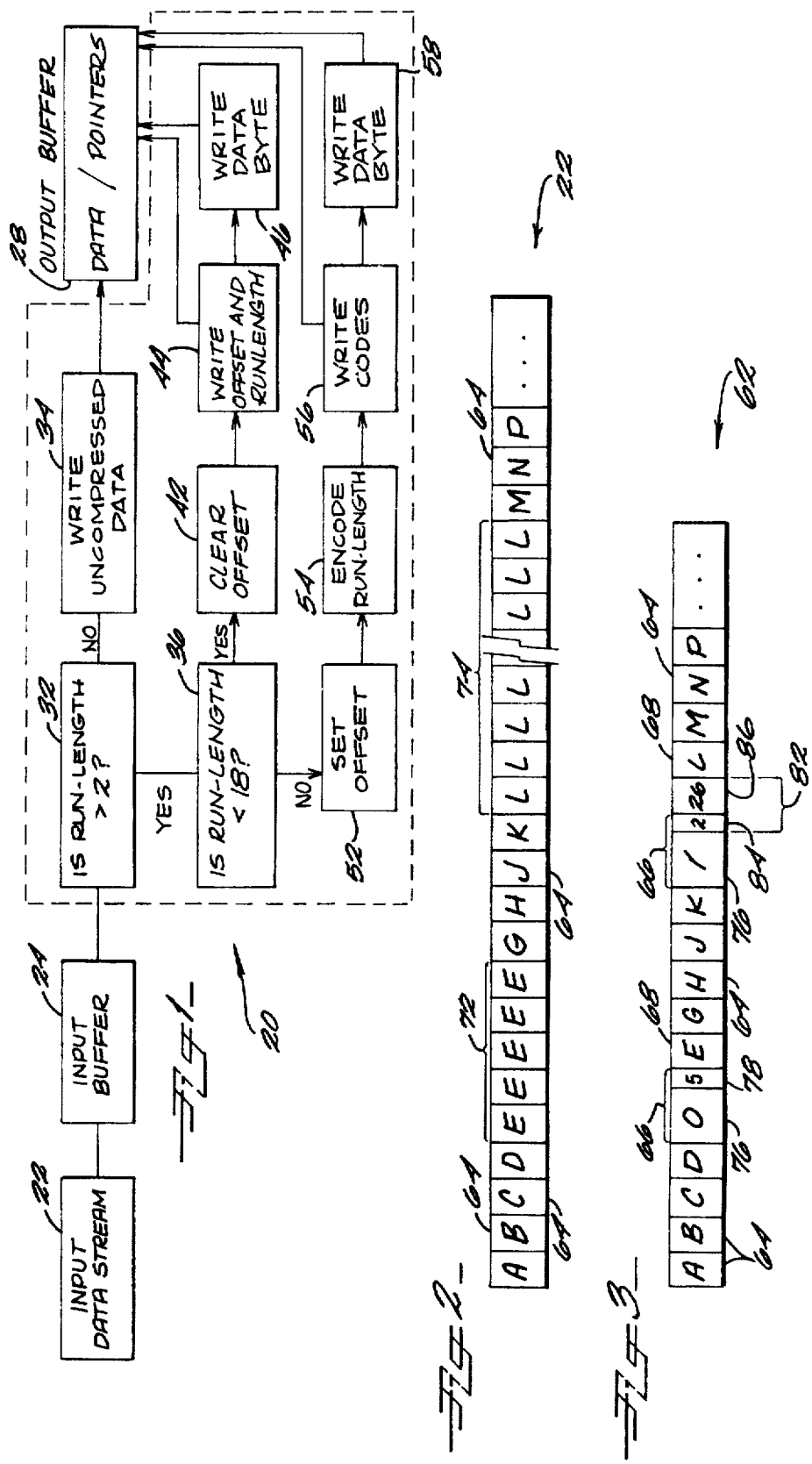

METHOD FOR COMPRESSION OF DATA USING SINGLE PASS LZSS AND RUN-LENGTH ENCODING

The United States Government has rights in this invention pursuant to Contract No. DE-AC09-89SR18035 between the U.S. Department of Energy and Westinghouse Savannah River Company.

BACKGROUND OF THE INVENTION

1. Field of the Invention

The present invention relates to methods for compressing binary data. More particularly, the present invention relates to a method for compressing digital data using LZSS compression and run-length encoding.

2. Discussion of Background

Information processing systems, data transmission systems and the like frequently store large amounts of binary data in a mass memory storage device or transfer binary data from one memory storage device to another. Memory storage devices include tape drives, hard disk drives and other magnetic or optical media, all of which have a limited amount of space. To make better use of the fixed storage capacity of memory storage devices, methods have been developed to "compress" the stream of data for storage. "Compressing the data" means that data is not stored literally but rather, where possible, the data is replaced with shorter expressions of it that can be decoded to restore the data to its original, literal condition when the data is brought out of storage. The original input data stream can be reconstructed from the compressed data stream using a decompressor/decompression unit.

There are two major families of data compression methods. Both of these families are derived from methods developed by Ziv and Lempel. The first family of methods is known as LZ77 and the second family is known as LZ78. Both methods compress the data stream by dividing the input data stream into a data string typically being at least one byte in length and then replacing strings that repeat a previous string with codes indicating that a particular string is a duplicate of a predecessor.

The codes can take different forms depending on the compression encoding scheme. For many LZ-based compression methods, each of the codes includes a "run-length" and an "offset." The run-length represents the number of data bytes in the data string being repeated and the offset represents the location or index of the data string being repeated. In this configuration, the codes are usually two bytes or 16 bits in length, with 4 bits being allocated for the run-length part of the code and 12 bits being allocated for the offset part of the code.

Data bytes that are repeated can be represented by codes comprised of a run-length and the actual data byte being repeated. In this configuration, for a 16 bit code, 8 bits are typically allocated for the run-length part of the code and 8 bits are allocated for the actual data byte being repeated. For example, see portions of the encoding scheme in U.S. Pat. No. 4,586,027, issued to Tsukiyama, et al.

Despite the numerous encoding schemes known in the prior art, most only allocate 4 or 8 bits for the run-length part of the code, therefore, run-lengths of more than 15 bytes (represented by the four-bit binary number 1111) or 255 bytes (represented by an eight-bit binary number) must be encoded using more than one code. The use of more than one code to represent a single, large data string is inefficient, especially for data strings having large numbers of identical data bytes in succession, such as data representing scanned multi-bit/pixel images.

Also, in some of these compression methods, the code turns out to be longer than the string of data bytes being represented, creating data "expansion" for that string. Consequently, a variation of LZ77-based compression methods was introduced by Storer (see U.S. Pat. No. 4,876,541) and Szymanski to eliminate this problem. In their method, which is known as LZSS, a "sliding window" is used, thus allowing symbols to be taken directly from the input data stream and used whenever a code would be longer than the repeating data string being represented. Also, a flag bit is added to each code and each data byte to distinguish them from each other.

However, current LZSS-based compression methods and run-length encoding schemes must be performed independent of one another. That is, a first "pass" must be made using LZSS compression methods and then a second pass must be made using run-length encoding techniques. The use of more than a single pass to take advantage of both LZSS compression and run-length encoding is time-consuming and thus inefficient. Therefore, a more efficient coding scheme is needed to take advantage of both compression methods without having to make multiple passes at the data.

SUMMARY OF THE INVENTION

According to its major aspects and broadly stated, the present invention is a method for compressing a stream of digital data in the form of a series of data bytes. In particular, it is a single pass compression system modified to use LZSS-based compression along with a run-length encoding scheme especially suited for strings of identical data bytes having large run-lengths, such as data representing scanned images. The encoding method comprises reading an input data stream to determine the lengths of data strings. For data strings having run-lengths greater than 2 bytes but less than 18 bytes, a "cleared" offset and the actual run-length are written to an output buffer and then a run byte is written to the output buffer. For data strings of 18 bytes or longer, a "set" offset and an encoded run-length are written to the output buffer and then a coded run-length byte is written to the output buffer. The first of two parts of the encoded run-length is the quotient obtained when 255 is divided into the run length; the second part is the remainder from this division. Data bytes that are not part of repeating data strings of sufficient length, less than three bytes according to a preferred embodiment of the present invention, are written directly to the output buffer.

A major feature of the present invention is the two-part encoding scheme for large strings of identical data bytes that uses multiples of 255 for the first part and the remainder between the actual run length and the nearest whole multiple of 255 for the second part. The advantage of this feature is that data strings having an extremely large number of identical data bytes in succession can be effectively and accurately represented by a single encoding event equivalent to two words (32 bits) of data. In this manner, up to 4079 identical and continuous data bytes can be represented by a single encoding event. Thus, for data streams that include large strings of identical bytes, the compression achieved by the present method is far greater than prior art compression methods using a standard LZ-based method.

Also, using reverse indexing as part of LZSS-based compression allows the present invention to employ both run-length encoding along with the LZSS-based compression in a single compression pass. Reverse indexing eliminates the "sliding window" concept of LZSS-based compression methods. It also allows offset codes of 0 and 1 to be used as part of the run-length encoding, because offsets of 0 or 1 cannot occur in reverse indexing schemes. These advantages simplify normal LZSS-based compression code to the extent that it can be modified so that run-length encoding is used in the same pass as the LZSS-based compression method.

Another feature of the present invention is the three layer approach to encoding. Specifically, for strings of fewer than three identical bytes, no compression is attempted; for strings between three and 17 bytes, the actual run length is used; and for very long strings, more than 18 bytes, the run length is encoded. This three layer approach recognizes the importance of time in compressing and decompressing data which can offset the value of saved storage space if the savings are small.

Other features and advantages of the present invention will be apparent to those skilled in the art from a careful reading of the Detailed Description of a Preferred Embodiment presented below and accompanied by the drawings.

BRIEF DESCRIPTION OF THE DRAWINGS

In the drawings,

FIG. 1 is a schematic diagram of a compression method according to a preferred embodiment of the present invention;

FIG. 2 is a diagram of a sample input data stream for compression; and

FIG. 3 is a diagram of a compressed output data stream using the encoding scheme according to the method of the present invention.

DETAILED DESCRIPTION OF A PREFERRED EMBODIMENT

In the following description similar components are referred to by the same reference numeral in order to simplify the understanding of the sequential aspect of the drawings.

Data compression involves reducing the actual amount of data taken from an input device and writing the reduced amount to an output device. The input device typically has an input buffer that receives a sequential stream of input data. The input data stream is preferably divided into a series of individual data bytes, each of which is usually comprised of eight bits. Each group of eight bits, that is, each data byte, typically represents one character of text or other equivalent unit.

Many data compression methods have routines or techniques for compressing a continuous string of identical data bytes, for example, data bytes representing scanned multi-bit/pixel images. Encoding schemes for such a data string often involve configuring a code that represents the data string and writing the code to a buffer in the output device. The code can, and typically does, include the actual data byte being repeated (referred to as the "run byte") but it also includes the run-length of the data byte string, that is, the number of times the run byte is repeated in succession.

Referring now to FIG. 1, the data compression method 20 in its preferred embodiment is shown schematically. According to the present invention, data from an input data stream 22 is transferred to an input buffer 24, where it is compressed using an encoding scheme (shown generally as box 26 and to be described in detail) as it is being transferred to an output buffer 28.

In general, input data stream 22 is transferred into input buffer 24 and then read sequentially to determine which data is to be compressed for storage and which data is to remain uncompressed. Input data stream 22 is read to find strings of identical data bytes occurring in succession and having a sufficient length, preferably a length of at least three, successive identical data bytes. Depending on their length, these strings are represented by a code in one of two forms. Data remaining uncompressed is written directly to output buffer 28.

Input data stream 22 can be stored in any type of input buffer 24, such as a hard disk or a magnetic tape drive, but is preferably a portion of the input/output buffer of the input device from which the data is being transferred. For example, input buffer 24 can be a portion of random access memory (RAM) configured especially for input/output operations.

As shown in FIG. 1, input data stream 22 is transferred to input buffer 24 in any convenient manner known in the prior art for transferring digital data. For example, input buffer 24 may be in connection with a serial register (not shown) so that input data stream 22 is loaded into input buffer 24 serially. Alternatively, a plurality of parallel registers (not shown) may be used to load input data stream 22 into input buffer 24.

Initially, encoding scheme 26 determines if data bytes from input data stream 22 are part of a string of identical data bytes having a run-length of greater than 2 bytes (shown as function box 32). If not greater than this preferred reference number, the data bytes are written directly to output buffer 28 (shown as function box 34) as uncompressed data bytes in the order in which they are read. The run-length preferably needs to be greater than 2 bytes because an extra byte in addition to the two-byte code is needed to encode the string of identical data bytes, as will be discussed in greater detail below.

If the run-length of the string of data bytes in question is greater than 2 bytes, it is then determined if the run-length is less than 18 bytes (as shown in function box 36). If the run-length is less than this preferred reference number, a clear offset (offset=0) is generated (function box 42) and the offset and the actual run-length are written to output buffer 28 (as shown in function box 44). Then, the run byte of the data string is written to output buffer 28 (shown as function box 46). Again, the information written to output buffer 28, whether in the form of uncompressed data bytes or encoded data, is written to output buffer 28 in the order in which input data stream 22 is read.

If the run-length of the data byte string in question is greater than or equal to the reference number 18, a set offset (offset=1) is generated (as shown in function box 52). Then, the run-length of the data byte string is encoded (shown generally as function box 54) and the offset and encoded run-length are written to output buffer 28 (shown as function box 56). Finally, the run byte itself is written to output buffer 28 (shown as function box 58).

In either encoding situation, the actual or encoded run-length may be written to output buffer 28 before the offset is written. However, consistency must be maintained throughout the compression method and with respect to the corresponding decompression method so that decompression is accurate.

In FIG. 2, a sample version of input data stream 22 is shown. In FIG. 3, an output stream of the input data stream 22 of FIG. 2 is shown compressed according to the preferred manner of the present invention. Referring again to FIG. 2, input data stream 22 preferably comprises a sequential series of data bytes 64, each of which is represented by a letter. Preferably, each data byte 64 is comprised of 8 bits and represents a text character or other equivalent unit. For example, one data byte might represent the integer portion of a number and the immediately following data byte may represent the fractional portion of that same number.

Output data stream 62, as shown in FIG. 3, preferably comprises a series of data bytes 64, along with codes 66 and run bytes 68, which will be discussed in greater detail below. In most LZ-based compression methods, each code 66 is preferably 2 bytes, or 16 bits in length. Also, similar to data bytes 64, each run byte 68 is preferably 8 bits in length.

Because input data stream 22 is read sequentially during compression, data bytes 64 being read form a plurality of data byte strings of varying length. For example, data bytes B, C and D form a three-byte data string, BCD, in byte position 2–4 of input data stream 22. Depending on the nature of input data stream 22, data strings may contain identical data bytes 64 in succession, such as the 5-byte data string EEEEE (shown generally as 72) in byte positions 5–9 of input data stream 22.

For example, if input data stream 22 represents scanned, multi-bit/pixel images, input data stream 22 may contain an extremely large number of identical bytes in succession, such as the blank areas or clear portions of a page being scanned. In the sample version of input data stream 22, it can be seen that, in addition to first data string 72 in byte positions 5–9, there is a large group (for purposes of this example, preferably 536 bytes in length) of data bytes "L" (shown generally as 74) in byte positions 14–549.

Both first data string 72 and second data string 74 are comprised of identical data bytes 64 occurring a given number of times in a row. For first data string 72, the data byte "E" is repeated 5 times. Stated another way, first data string 72 has a run-length of "5" and an "E" run byte. Similarly, second data string 74 has a run-length of 536 and an "L" run byte. It is these two data strings that will be used to demonstrate the encoding technique of the compression method according to the present invention.

In order to compress input data stream 22 according to the present invention, the data bytes 64 in input stream 22 are read sequentially, beginning with the data byte in position 1 ("A"). The compression method then looks ahead to see if "A" in position 1 is part of a data string of more than 2 identical data bytes occurring in succession. Because "A" in position 1 is not part of such a data string, it will therefore be moved to output buffer 28 as an uncompressed data byte. Thus, the value "A" is written directly to output buffer 28, preferably using a byte move instruction.

Next, the data byte 64 in position 2 ("B") is read and determined to be not a part of a data string of interest. Thus, "B" is written directly to output buffer 28 using a byte move instruction. Similar read and write operations occur for data bytes 64 in positions 3 and 4 ("C" and "D", respectively) because neither data byte is part of a string of identical data bytes having a run-length greater than 2.

Upon reading the data byte 64 in position 5 ("E"), the compression method looks ahead and sees identical data bytes 64 in positions 6, 7, 8 and 9. Thus, the data bytes 64 in positions 5–9 are all a part of a string of identical bytes ("E") having a run-length greater than 2. Accordingly, the data string in positions 5–9 is to be encoded in one of two ways, depending on whether or not the string's run-length is less than 18 bytes (see function box 36 in FIG. 1).

Because first data string 72 has a run-length of less than the preferred reference number 18, namely 5, it is compressed in the manner as shown in function boxes 42, 44, and 46 of FIG. 1, with the resulting data written to output buffer 28 as shown in FIG. 3. That is, first data string 72 is written to output buffer 28 as code 66 followed by run byte 68.

In most LZ-based compression methods, the code consists preferably of an offset and a run-length that are collectively the length of 2 data bytes, or 16 bits. Offset 76, which is used to index previously read data strings, often occupies 12 of the 16 bits. Of course, code 66 may be of a different size and bit allocations to the offset and run-length parts thereof may differ depending on the specific LZ-based compression method being used.

Also, different indexing schemes can be used within the particular LZSS-based compression method in use. For example, reverse indexing is a desired indexing scheme for use in LZSS-based compression code because it eliminates the need for maintaining a "sliding window" in normal LZSS-based compression. Also, when using reverse indexing, offsets of 0 or 1 are never generated because data strings must be at least 2 and preferably at least 3 bytes in length before the contents of the data string is configured in the manner described herein. Thus, the present invention uses offsets of 0 or 1 to indicate the configuration of a data string according to the present invention.

In the present invention, code 66 is comprised of an offset 76, which is 12 bits in length, and a run-length 78, which is 4 bits in length. When a data string having a run-length greater than 2 bytes but less than 18 bytes is read, a cleared offset (offset=0) and the actual run-length of the data string is written to output buffer 28, followed by the run byte of the data string. Thus, for first data string 72, offset 76 having the value "0" and run-length 78 having the value "5" is written to output buffer 28. Then, run byte 68 having the value "E" is written to output buffer 28.

Therefore, first data string 72, which is a 5-byte data string from input data stream 22, is represented in output stream 62 by a 2-byte code 66 and a single run byte 68. Although compression in this case was only from 5 bytes to 3 bytes, compression ratios are, of course, much greater for data strings having long run-lengths, specifically having run-lengths of longer than 18 bytes.

After first data string 72 is read from input data stream 22 and code 66 and run byte 68 are written to output buffer 28, the data byte "G" in position 10 of input data stream 22 is read. Accordingly, the value "G" is written directly to output buffer 28 because "G" in position 10 of input data stream 22 is not part of a string of identical data bytes. Each remaining position of input data stream 22 is read sequentially in the manner described above until second data string 74 is read.

Second data string 74 is a 536-byte string within input data stream 22, as shown partially in FIG. 2. For data strings having run-lengths longer than 18 bytes, a set offset (offset=1) and a two-part, encoded run-length, rather than the actual run length, is written to output buffer 28, followed by a run byte for the data string. In the case of second data string 74, offset 76 having the value "1" and encoded run-length 82 is written to output buffer 28. Run byte 68 is then written to output buffer 28 after encoded run-length 82.

Unlike the actual run-length value of data strings less than 18 bytes (such as run-length 78), encoded run-length 82 is comprised of a first part 84 and second part 86. To generate first and second parts 84, 86, the actual run-length of the data string is divided by a factor of 255 to obtain a quotient and a remainder. The quotient, which cannot exceed 4 bits in length in this preferred embodiment, is written to output buffer 28 as first part 84 of encoded run-length 82. Similarly, the remainder, which is preferably an extra 8-bits in length, is written to output buffer 28 as second part 86 of encoded run-length 82.

In the case of second data string 74, the factor of 255 can be divided into 536 a total of 2 times with a remainder of 26 (2×255=510; 536−510=26). Thus, first part 84 having the value "2" and second part 86 having the value "26" are written to output buffer 28. Then, run byte 68 having the value "L" is written to output buffer 28.

Therefore, second data string 74, which is a 536-byte data string within input data stream 22, is represented in output stream 62 by a 2-byte (or 16-bit) code 66 (a 12-bit offset and a 4-bit first part 84 of encoded run-length 82), an extra byte (8-bit second part 86 of encoded run-length 82) and a single run byte 68. Thus, the 536-byte second data string 74 has been represented in output stream 62 as a 4-byte code.

Compression in this manner can accommodate data strings having run-lengths of up to approximately 4080 bytes. That is, first part 84 of encoded run-length 82 is 4-bits in length and can hold a value of up to 15 (1111 in binary form). Thus, 255 can be divided into the data string run-length up to 15 times with an available remainder of 254 (for a total of 4079 bytes) before the next compression event is needed.

The present compression method can be used alone but is preferably used in conjunction with other LZSS-based or similar compression methods, including bit flag partitioning methods. Such methods are described in the commonly assigned and co-pending application entitled "Method for Compression of Binary Data". As discussed previously, the present compression method works particularly well with LZSS-based compression methods using reverse indexing because run-lengths must be at least 2 bytes in length and therefore offsets of 0 or 1 will never be generated as part of output stream 62. Thus, values of 0 and 1 can be written in the offset location of codes 66 to indicate strings of identical data bytes without causing confusion with the normal data written into the offset location as part of reverse indexing or other compression techniques.

Using the present compression scheme in conjunction with other compression methods involves slightly modifying the code of the other compression method being used. Such modification involves looking for data strings having at least 3 identical data bytes in succession. Also, the compression code is modified so that those data strings are encoded in one of the two ways, depending on whether the run-length is greater than or equal to 18 bytes, as discussed.

Finally, the compression code is modified so that, in the event that a particular data string is compressed more effectively using one compression technique rather than the other, the most effective compression technique will be used. Such is achieved by comparing the respective output codes using each compression technique and then choosing the most favorable output code prior to writing the output code to the output buffer.

By allowing the present invention to be used in conjunction with other compression methods, such as normal LZSS-based compression techniques, data can be compressed by both compression methods in a single pass of the data. Otherwise, compression of the data would require a first pass using the normal LZSS-based compression technique and a second pass using the compression scheme of the present invention.

During decompression, the compressed output data stream 62, as shown in FIG. 3, becomes the input stream to the decompressor (not shown). To decompress output data stream 62, offsets 76 are read to check for values of "0" or "1". If offset 76 has a value of "0", the run-length 78 following offset 76 is read and run byte 68 following run-length 78 is written to the new output buffer (not shown) the number of times read in run-length 78. If offset 76 has a value of "1", first and second parts 84, 86 of encoded run-length 82 are read, the run-length is calculated and run byte 68 following encoded run-length 82 is written to the new output buffer the number of times calculated.

It will be apparent to those skilled in the art that many changes and substitutions can be made to the preferred embodiment herein described without departing from the spirit and scope of the present invention as defined by the appended claims.

What is claimed is:

1. A method for compressing a series of data bytes being transferred from an input buffer to an output buffer, said series including a number of data bytes in a repeating string of data bytes, each byte in said string of data bytes being identical, said method comprising the steps of:

reading said series of data bytes into said input buffer;

determining said number of data bytes in said repeating string of data bytes;

comparing said number to a first reference number, and, if said number exceeds said first reference number, dividing said string of repeating data bytes by a factor to determine a quotient and a remainder, representing said number by a first code having a first part and a second part, said first part being said quotient and said second part being said remainder, identifying said first code with a first offset where said first offset is one of a set offset and a cleared offset, and writing said first offset, said first code, and said data byte to said output buffer; but, if said number does not exceed said first reference number, comparing said number to a second reference number, and, if said number does not exceed said second reference number, writing said data byte to said output buffer.

2. The method as recited in claim 1, further comprising the steps of:

comparing said number to said second reference number; and, if said number does not exceed said first reference number but exceeds said second reference number, representing said repeating data bytes by a second code including said number and said data byte;

identifying said second code with a second offset where said second offset is one of a set offset and a cleared offset; and writing said second offset, said number and said data byte to said output buffer.

3. The method as recited in claim 2, wherein said first reference number is 17 and said second reference number is 2.

4. The method as recited in claim 1, wherein said first reference number is 17.

5. The method as recited in claim 1, wherein said first reference number is 17 and said factor is 255.

6. The method as recited in claim 1, wherein said first part includes not more than four bit locations.

7. The method as recited in claim 6, wherein said second part has eight bit locations.

8. The method as recited in claim 6, wherein said first offset is a set offset and said second offset is a cleared offset.

9. The method as recited in claim 1, wherein said second part includes not more than eight bit locations and said factor is 255.

10. A method for compressing a series of data bytes being transferred from an input buffer to an output buffer, said series including a number of data bytes in a repeating string of data bytes, each byte in said string of data bytes being identical, said method comprising the steps of:

reading said series of data bytes into said input buffer;

determining said number of data bytes in said repeating string of data bytes;

comparing said number to a first reference number, and, if said number exceeds said first reference number, dividing said string of repeating data bytes by a factor to determine a quotient and a remainder, representing said number by a first code having a first part and a second part, said first part being said quotient and said second part being said remainder, identifying said first code with a first offset where said first offset is one of a set offset and a cleared offset, and writing said first offset, said first code, and data byte to said output buffer; but, if said number does not exceed said first reference number, comparing said number to a second reference number, and, if said number does not exceed said first reference number but exceeds said second reference number, representing said repeating data bytes by a second code including said number and said data byte, identifying said second code with a second offset where said second offset is one of a set offset and a cleared offset, and writing said second offset, said number and said data byte to said output buffer;

but if said number does not exceed said second reference number, writing said data byte to said output buffer.

11. The method as recited in claim 10, wherein said first reference number is 17.

12. The method as recited in claim 10, wherein said first reference number is 17 and said second reference number is 2.

13. The method as recited in claim 10, wherein said factor is 255.

14. The method as recited in claim 10, wherein said factor is 255 and said first reference number is 17.

15. The method as recited in claim 10, wherein said factor is 255, said first reference number is 17 and said second reference number is 2.

16. The method as recited in claim 10, wherein said first part includes not more than four bit locations.

17. The method as recited in claim 10, wherein said second part includes not more than eight bit locations and said factor is 255.

18. A method for compressing a series of data bytes being transferred from an input buffer to an output buffer, said series including a number of data bytes in a repeating string of data bytes, each byte in said string being identical, said method comprising the steps of:

reading said series of data bytes into said input buffer;

determining said number of data bytes in said repeating string of data bytes;

comparing said number to 17, and, if said number exceeds 17, dividing said string of repeating data bytes by 255 to determine a quotient and a remainder, representing said number by a first code having a first part and a second part, said first part being said quotient and said second part being said remainder, said first part having four bit locations, identifying said first code with a first offset where said first offset is one of a set offset and a cleared offset, and writing said first offset, said first code, and said data byte to said output buffer; but, if said number does not exceed 17, comparing said number to 2, and, if said number does not exceed 17 but exceeds 2, representing said repeating data bytes by a second code including said number and said data byte, identifying said second code with a second offset where said second offset is one of a set offset and a cleared offset, and writing said second offset, said number and said data data byte to said output buffer;

but if said number does not exceed 2, writing said data byte to said output buffer.

* * * * *